United States Patent
Verschuuren

(10) Patent No.: US 11,981,052 B2
(45) Date of Patent: May 14, 2024

(54) PNEUMATIC SYSTEM, IMPRINT APPARATUS AND USE THEREOF

(71) Applicant: KONINKLIJKE PHILIPS N.V., Eindhoven (NL)

(72) Inventor: Marcus Antonius Verschuuren, Berkel-Enschot (NL)

(73) Assignee: Koninklijke Philips N.V., Eindhoven (NL)

(*) Notice: Subject to any disclaimer, the term of this patent is extended or adjusted under 35 U.S.C. 154(b) by 294 days.

(21) Appl. No.: 17/291,639

(22) PCT Filed: Nov. 8, 2019

(86) PCT No.: PCT/EP2019/080698
§ 371 (c)(1),
(2) Date: May 6, 2021

(87) PCT Pub. No.: WO2020/099265
PCT Pub. Date: May 22, 2020

(65) Prior Publication Data
US 2022/0288815 A1  Sep. 15, 2022

(30) Foreign Application Priority Data

Nov. 14, 2018 (EP) .................................... 18206182
Nov. 15, 2018 (EP) .................................... 18206617

(51) Int. Cl.
*B29C 33/24* (2006.01)
*B29C 33/42* (2006.01)
(Continued)

(52) U.S. Cl.
CPC ............ *B29C 33/24* (2013.01); *B29C 33/424* (2013.01); *B29C 59/002* (2013.01);
(Continued)

(58) Field of Classification Search
None
See application file for complete search history.

(56) References Cited

U.S. PATENT DOCUMENTS

2004/0011231 A1 1/2004 Hall et al.
2004/0261981 A1 12/2004 McCoy et al.
(Continued)

FOREIGN PATENT DOCUMENTS

WO 2003099463 A2 12/2003
WO 2005101466 A2 10/2005
(Continued)

OTHER PUBLICATIONS

Marzolin et al "Fabrication of Glass Microstructures by Micro-Molding of Sol-Gel Precursors" Advanced Materials 1998 vol. 10(8) p. 571.
(Continued)

*Primary Examiner* — Robert J Grun

(57) ABSTRACT

A method of imprinting a substrate (180), comprising affixing a flexible stamp (104) carrying an imprinting pattern (106) to a first carrier (102) comprising an array of apertures (112) which, by gas pressure, either pull the flexible stamp towards the first carrier or push it away; pushing it to a second carrier (170) carrying a substrate (180) with a resist layer (182), leaving a gap (190) for creating a controllable contact area between the flexible stamp and the substrate and space (196) between the first carrier and the flexible stamp; progressively pushing areas of the flexible stamp into the resist layer to imprint it; developing the resist layer; and progressively releasing the flexible stamp by applying suction through successive apertures whilst controlling the inward flow of gas to the space (196) through the apertures
(Continued)

that are not yet under suction in order to maintain the space (196) there above ambient but below a predetermined maximum pressure.

18 Claims, 8 Drawing Sheets

(51) Int. Cl.
*B29C 59/00* (2006.01)
*B29C 59/02* (2006.01)
*B29C 37/00* (2006.01)

(52) U.S. Cl.
CPC ...... *B29C 59/026* (2013.01); *B29C 2033/426* (2013.01); *B29C 2037/90* (2013.01)

(56) References Cited

U.S. PATENT DOCUMENTS

| | | |
|---|---|---|
| 2004/0264019 A1 | 12/2004 | Curtiss et al. |
| 2005/0230882 A1 | 10/2005 | Watts et al. |
| 2017/0192350 A1* | 7/2017 | Verschuuren ......... G03F 7/0002 |

FOREIGN PATENT DOCUMENTS

| | | |
|---|---|---|
| WO | 2006117745 A2 | 11/2006 |
| WO | 2008068701 A2 | 6/2008 |
| WO | 2009141774 A1 | 11/2009 |
| WO | 2015150110 A1 | 10/2015 |

OTHER PUBLICATIONS

International Search Report and Written Opinion From PCT/EP2019/080698 dated May 22, 2020.

* cited by examiner

PNEUMATIC SYSTEM, IMPRINT APPARATUS AND USE THEREOF

CROSS REFERENCE TO RELATED APPLICATIONS

This application is a U.S. national phase application of International Application No. PCT/EP2019/080698 filed on Nov. 8, 2019, which claims the benefit of EP Application Serial No. 18206182.0 filed Nov. 14, 2018 and EP Application Serial No. EP18206617.5 filed Nov. 15, 2018 and are incorporated herein by reference.

FIELD OF THE INVENTION

The present invention relates to a method of imprinting a substrate using a flexible stamp, a computer program product for executing the imprinting method on an imprinting apparatus and to an imprinting apparatus for performing the imprinting method.

BACKGROUND OF THE INVENTION

Imprint lithography is a contact lithography method in which a relief pattern carried on a stamp is transferred to a substrate by bringing the stamp in contact with the substrate. An example of such technique is disclosed in EP 3126909A. It stands apart from more traditional non-contact (e.g. optical) lithography techniques, as it promises to be able to provide small feature size patterns at reduced cost on many sorts of flat and even non-flat substrates and for use in manufacture of e.g. semiconductor or optical devices.

Two types of imprint lithography may be distinguished based on use of a rigid (non-flexible) stamp made of e.g. quartz, or of a flexible stamp made of e.g. polysiloxane rubber. Substrate conformal imprinting lithography (SCIL) is of the latter type. Typically, such method includes the following steps. In the imprinting step, a flexible stamp having a relief feature pattern on its surface is brought into contact with a material imprintable by the relief feature pattern. Such material generally is deformable by the relief features and hence is most often a liquid (solution or melt) at imprinting conditions. The imprintable material is sometimes referred to as an imprint resist or ink and is usually applied in layer form on a substrate before the imprinting step is performed. During this imprinting step, the imprintable material fills the recesses of the relief pattern and once this has occurred, the imprintable material is solidified in the presence of the stamp in a next step. The solidification is sometimes referred to as curing or developing of the imprintable material and the step may be named after that. Subsequent removal of the flexible stamp from the solidified imprintable material in a step referred to as stamp release, leaves a solid layer on the substrate which has a relief pattern that is complementary to that of the flexible stamp. This solid layer can be used for various purposes such as e.g. functional device layer or etch mask layer in further processing.

The imprinting apparatus disclosed in WO 2008/068701 A2 can be used for substrate conformal imprint lithography. In this apparatus, a flexible stamp is pneumatically operated or manipulated. In particular, the flexible stamp is held by a carrier and positioned parallel to a substrate on a chuck with a small gap between them. The stamp is held in place on, and manipulated during the imprint and release steps by, the carrier which to this end has a plurality of pneumatically operated grooves that may be switched between an underpressure (e.g., vacuum) and an overpressure both with regard to ambient pressure. The underpressure is used to pull the stamp towards the carrier to hold it or keep it away from the substrate. The overpressure is used to force the stamp from the carrier towards the substrate. By subsequent switching of neighborinq grooves from underpressure to overpressure during the imprint step a gradual contact (gradually increasing contact area) between stamp and substrate can be achieved. Similarly, by subsequent switching of neighboring grooves from overpressure to underpressure during the release step a gradual release of stamp from the substrate can be achieved.

It is desirable to maximize the throughput of such an imprinting process. This, however, is far from trivial as increased throughput may compromise the quality of the pattern formed in the resist layer. It is possible to individually optimize the throughput of the imprinting step and the release step, i.e., that these steps may be performed at different speeds. Typically, the imprinting step can be performed at higher speeds than the release step. This for instance can be due to attractive forces between stamp and substrate which, on one hand, may help in the imprinting step due to the pattern being pulled into the resist layer by e.g., capillary forces, and on the other hand, may hamper release during the release step by opposing the forces for pulling the stamp away from the substrate.

To implement the different speeds of imprinting and releasing steps using the aforementioned device, the rate of adding grooves to the set of grooves at overpressure during the imprinting step may be different to the rate of taking away grooves from the set of grooves at overpressure during the release step. This may for instance be defined by a user of the apparatus prior to the imprinting cycle in order to improve the throughput of the imprinting process.

SUMMARY OF THE INVENTION

The inventor has observed irregularities of imprint quality control during optimization of imprinting and/or release step with regard to throughput. The irregularities have been found to be related to the pneumatic control of the grooves in the different processes. Hence there is a need for improvement of pneumatic control of the apertures for an imprinting process and apparatus.

The present invention seeks to at least partly fulfil this need. Embodiments of the present invention are defined by the claims.

According to an aspect, there is provided a pneumatic system for an imprinting apparatus as defined in claim 1.

This first carrier is able to hold or release the flexible stamp by the pressure balance between reference pressure (usually the pressure of the environment wherein the first carrier is operated) which tends to push the stamp against the first carrier and aperture pressure which can either be below the reference pressure (as with the holding pressure) or be above the reference pressure (as with the releasing pressure). This first configuration is for holding the stamp and the second configuration is for releasing the stamp.

The pneumatic system comprises a high pressure duct system for providing the releasing pressure to each one of the plurality of pneumatically operated apertures, the high pressure duct system being configured to:

comprise a gas entrance opening for receiving gas at a supply pressure from a gas supply; and comprise a pressure regulator for regulating the releasing pressure for one or more apertures of the array of apertures connected to a section of the high pressure duct system to be between a regulator pressure set by the pressure regulator and the supply pressure, when the gas supply is attached to the high pressure duct system, while at least temporarily allowing a gas flow from the gas supply along the section of the high pressure duct system towards the pressure regulator.

The pressure control in the high pressure duct system can be improved with the pressure regulator both for performing an imprinting step when apertures are switched from the first configuration to the second configuration and for performing a stamp release cycle when apertures are switched from the second configuration to the first configuration. In particular pressure variations in the apertures and a space between the stamp and the first carrier present during the switching of apertures can be reduced and therewith the quality and control over the imprint process increased.

The pressure regulator may comprise or consist of a backpressure regulator. The backpressure regulator is connected to the high pressure duct system with its input and since such a device is designed to control its input pressure to a predetermined regulator pressure, by venting off gas from the duct system, they provide a good outlet pressure control.

The pneumatic system may comprise a forward pressure regulator connected to the high pressure duct system and for connecting to the gas supply, the forward pressure regulator being configured for controlling the supply pressure. The forward pressure regulator can be a pressure reducing regulator connected to the duct system with its output. Since it is a device that regulates its output pressure according to a predetermined pressure setting the supply pressure is now continuously controlled. The forward pressure regulator can also be part of the pressure supply as long as it is connected between the pressure source and the gas entrance of the high pressure duct system.

The pneumatic system may comprise a plurality of openings disposed along the section of the high pressure duct system each one of the openings for connection to a respective one of the plurality of apertures. In this setup the plurality of apertures is connected in series between the pressure regulator and the pressure supply so that only one duct is needed in the system to control all of the release pressures in the apertures. In an alternative setup the high pressure duct system comprises at least two high pressure ducts each connected to the gas entrance opening with one end and each one connected to the pressure regulator where each duct has a part of the section of the high pressure duct system.

The pneumatic system may comprise:
a pressure sensor for sensing the releasing pressure, and
a pressure sensor controller for controlling the pressure sensor to adjust the regulator pressure in dependence of the sensed releasing pressure.

There may be a further controller for controlling the supply pressure of the gas supply in dependence of the sensed releasing pressure.

The pneumatic system preferably comprises at least one gas flow regulator connected to the high pressure duct (706) for adjusting the gas flow in the high pressure duct system at a location between the gas entrance opening and one or more of the apertures of the plurality of apertures. This provides a good control over gas flow during both imprint cycle and release cycle. The pressure control of the pneumatic system providing increased gas flow during imprint also provides a relatively high gas flow from source to apertures and thus the space between the stamp and the first carrier during a release cycle. This is unwanted as will be explained in more detail herein below and the gas flow regulator can be used to reduce the gas flow during the release step cycle. The gas flow regulator may be controllable by a controller.

The pneumatic system may further comprise a low pressure duct system for providing the holding pressure to each one of the plurality of pneumatically operated apertures, the low pressure duct system being configured for connection to a gas removal unit for providing the holding pressure. This is the system for providing the first configuration to the apertures. The gas removal unit can be a vacuum pump with e.g. pressure control or a vacuum vessel or other device for creating an underpressure.

The pneumatic system or the first carrier may comprise a pressure switching unit connected between the low pressure duct system and each one of the plurality of pneumatically operated apertures and connected between the high pressure duct system and each one of the plurality of pneumatically operated apertures, the switching unit being configured for individually switching each one of the plurality of pneumatically operated apertures between the holding pressure and the releasing pressure. The switching unit can have a plurality of valves configured for individually switching a particular one of the plurality of apertures between the first configuration and the second configuration.

The invention provides an imprinting apparatus comprising:
the pneumatic system as claimed in any one of the previous claims and
a first carrier (102) for holding a flexible stamp (104) having an imprinting pattern (106) the first carrier having an array of pneumatically operated apertures (112) each one of the pneumatically operated apertures being operable in a first configuration in which a holding pressure is provided to it for holding a part of the flexible stamp relative to the first carrier and operable in a second configuration in which a releasing pressure is provided to it for releasing the part of the flexible stamp from the first carrier.

The imprinting apparatus can have a second carrier for holding a substrate. It can have one or more controllers for controlling one or more of the pressure regulator, the flow regulator or the pressure supply or the first carrier and/or second carrier positioning during operation of the device. The one or more controllers can have processing elements for performing computer programs that cause the controllers to implement methods of imprinting.

According to another aspect of the invention there is provide a use or a method of use of the pneumatic system or the imprinting apparatus as claimed in any of the previous claims for performing an imprinting process.

The use can be such that the imprinting process includes an imprinting step by switching apertures from first configuration to the second configuration and during which step the supply pressure is regulated at a value higher than 10 mBar or higher than 50 mBar above the reference pressure and 500 mBar below the reference pressure and the regulator pressure is set at a value of higher than 0 mBar or higher than 5 mBar and a value lower than the regulated supply pressure such as e.g. lower than 50 mBar.

The use can be of an imprint apparatus comprising the one or more flow regulators as defined in the claim 8 and the imprinting process can further comprise a stamp release step, wherein the flow rate in the stamp release step as controlled by the flow regulator is lower the flow rate as controlled by the one or more flow regulators in the imprint step.

Further methods may be implemented according to the below definitions. The method comprises performing an imprinting step including imprint switching of successive apertures (112) in the array of apertures residing in the first configuration to the second configuration for applying the flexible stamp with its imprinting pattern to the substrate, thereby creating a space (196) between the part of the flexible stamp so applied to the substrate and the first carrier, wherein, during the imprint switching, the overpressure of the apertures in the second configuration is regulated to be within a range between 0 mBar and a maximum overpressure.

The method thus makes use of pressure control in the apertures that are in the second configuration during imprint switching of the apertures, i.e. during switching of apertures from the first configuration at underpressure to the second configuration at overpressure. In particular the pressure regulation specifies that the pressure in an aperture does not drop below a pressure that is above the reference pressure by an amount of the overpressure that is regulated. Furthermore, the pressure is also regulated such that it cannot exceed the sum of the reference pressure and a maximum overpressure. This allows high gas flow at maximum overpressure pressure for the pressure regulation.

Preferably, during the imprinting and/or the releasing step, the overpressure is regulated at all the apertures that reside in the second configuration.

The maximum overpressure may be lower than 500 mBar, preferably lower than 200 mBar or lower than 100 mBar, and even more preferably lower than 50 mBar.

The overpressure during imprint switching is preferably regulated to be higher than 10 mBar. This provides a suitable pressure to keep a steady application of the stamp to the substrate. The overpressure in the imprinting step is preferably below 50 mBar. This range is suitable for providing sufficient force for pushing away the stamp from the first carrier.

The method preferably further comprises, after the imprinting step, performing a stamp releasing step including release switching of the successive apertures residing in the second configuration to the first configuration to remove the part of the stamp applied to the substrate from the substrate and pull it against the first carrier thereby reducing the space (196), wherein, during the release switching, the overpressure of apertures still residing in the second configuration is regulated to be between 0 mBar and a further maximum overpressure.

During the release switching of the apertures, there may be a large space at overpressure between the flexible stamp and the first carrier at locations where the stamp has been applied to the substrate. Switching one or more apertures at such location to the underpressure may lead to rapid loss of overpressure in the space again causing a pressure wave. Therefore, the overpressure is regulated to be maintained above 0 mBar during the switching. The further maximum overpressure is preferably lower than the maximum overpressure. This may provide a limited overpressure in the space remaining in the second configuration for aiding release of the flexible stamp from the substrate. In addition, this can place a limit on the flow of gas from the apertures near the space that are in the second configuration to the apertures that have just been switched to the first configuration which may lead to a weakening of the underpressure supplied. This measure can thus improve throughput whilst maintaining quality.

Preferably during the release switching a gas flow to the apertures that still reside in the second configuration is regulated to be lower than the gas flow during the imprint switching. The gas flow regulation is independent from the pressure regulation. During the release switching the apertures pull the flexible stamp from the substrate by applying suction (underpressure) through first configuration apertures whilst some of the apertures are not under suction yet, i.e still reside in the overpressure configuration. This causes a gas flow from the latter to the first and this may lead to rapid loss of underpressure. A limitation of the gas flow, may reduce the effect whilst keeping the overpressure at regulated level. The aforementioned control of the pressure in the space between the first carrier and the stamp can be implemented by regulating the gas flow rate on a common supply to the apertures to be higher during imprinting than during stamp release. This was not possible with the closed pneumatic arrangement described in EP 3126909A and illustrated in FIG. 1.

The overpressure during the release switching is preferably regulated to be higher than 5 mBar or higher than 10 mBar and lower than 50 mBar, preferably lower than 20 mBar. This is appropriate for balancing the forces on the stamp as it is released, avoiding e.g. a complete vacuum in the space which could lead to lack of control.

The overpressure during the release switching is preferably regulated to be lower than the overpressure during the imprint switching. This helps provide an overall release force by the apertures at underpressure.

The underpressure in any of the above methods is in the range of 500 mBar to 900 mBar below the reference pressure and more preferably in the range of 700 mBar to 800 mBar below the reference pressure. This is found to be an appropriate range for adequate control of the release process with rapid cycling, and for holding the stamp before and after imprinting.

The method can comprise varying the overpressure during the imprint switching and/or during the release switching. This can be done to optimize the speed of the process whilst maintaining its quality.

The reference pressure usually is ambient pressure such as around 1000 mBar (1 atm) at normal temperature (e.g. between 15 and 25 C such as at 20 C). However, the reference pressure can be higher than ambient pressure. Such case does not influence the imprinting step as that is determined by the overpressures used and these are controlled relative to the reference pressure. However, the higher reference pressure does help in the stamp release step According to a further aspect, the invention provides a computer program comprising a computer-readable code storable on, or stored on a data carrier, or accessible through, or downloadable from a computer accessible network, which program, when run on a computer, causes an imprinting apparatus to perform the steps of any of the method claims. The code is configured such that the computer can control the controllers of the apparatus to control the aperture pressures and any devices for controlling the over and underpressure as well as the gas flow if needed.

The imprinting method may comprise before the imprinting step affixing a flexible stamp to the first carrier by switching at least some of the apertures of the array of apertures to the first configuration.

The imprinting method may comprise before the imprinting step providing a substrate to a substrate holder.

The imprinting method may comprise before the imprinting step, positioning the first carrier including the flexible stamp relative to a second carrier carrying the substrate (180) such that the imprinting pattern faces the substrate with a gap in between the flexible stamp and the substrate.

The method may comprise switching at least one of the apertures to the second configuration to create a first contact area between a part of the flexible stamp and the substrate and therewith a first space between the part of the flexible stamp and the first carrier and subsequently switching a next aperture in said array in a sequence to the second configuration to displace and/or expand the contact area.

The method may comprise developing the substrate surface when in contact with the relief layer of the flexible stamp.

According to a further aspect the invention provides an imprinting apparatus comprising a first carrier for holding a flexible stamp having an imprinting pattern, the first carrier comprising an array of apertures each one individually switchable between a first configuration in which an underpressure relative to a reference pressure is provided to it for pulling the flexible stamp towards the first carrier and a second configuration in which an overpressure relative to the reference pressure is provided to it for pushing the flexible stamp away from the first carrier. The operation of the first carrier is described with regard to the first aspect of the invention and is not repeated here.

The apparatus comprises a low pressure duct for providing the underpressure to the apertures. Low pressure refers to pressure below the reference pressure and in general is some kind of vacuum created by e.g. a vacuum vessel or pump.

The apparatus further comprises a high pressure duct for providing the overpressure to the apertures, the high pressure duct receiving gas from a gas supply at a supply pressure equal to or higher than a maximum overpressure;

wherein the apparatus comprises a backpressure regulator (702) connected to the high pressure duct (140) which can be set to regulate the overpressure in the duct to be between 0 mBar and the maximum overpressure. The backpressure regulator can be given a pressure setting above which it opens. Thus this regulator vents gas from the duct when the pressure in the duct overshoots the needed overpressure. Hence the regulator can be set to ensure a minimum overpressure less than the maximum overpressure.

The imprinting apparatus can further comprise a forward pressure regulator for regulating the supply pressure received by the duct.

The imprinting apparatus can comprise one or more gas flow regulator (706) between the supply of gas and one or more of the apertures, the one or more gas flow regulator for adjusting the gas flow form the supply of gas to the one or more of the apertures.

The imprinting apparatus can comprise gas valves for switching the individual apertures between their first and second configurations.

The imprinting apparatus (100) can comprise a pressure sensor for providing a sensor signal representative of the gas pressure in the duct (140), the backpressure regulator, the forward pressure regulator and/or the flow regulator are responsive to the sensor signal for adjusting the overpressure and/or the gas flow.

The imprinting apparatus can comprise a processing element for controlling the backpressure regulator (702) and/or the forward pressure regulator and/or the gas flow regulator.

This difference in flow can be used to ensure that the pressure in the space is optimal for both imprinting and release cycles, as described above. The greater flow is normally required in the imprinting step. Reduced flow is normally required in the release step, to limit the loss of vacuum whilst maintaining sufficient above ambient pressure in the space for efficient release.

Preferably the processing element is configured to control the first and second carriers, the gas supply and the gas evacuating means to:
 imprint the imprinting pattern in the resist layer on the substrate by controlling the apertures to expand a contact area between the flexible stamp and the substrate and to enlarge a space between the first carrier and the flexible stamp until the imprinting pattern is imprinted in the resist layer;
 release the flexible stamp by controlling the apertures to reduce the contact area between the flexible stamp and the substrate and to reduce the space until the imprinting pattern is released from the developed resist layer;
 during the imprinting process, provide the overpressure through all the apertures that are switched to the second configuration, to maintain the pressure in the space above ambient pressure;
 and during the releasing process, provide the underpressure through all the apertures that are switched to the first configuration whilst regulating an inward flow of gas to the space through the apertures that remain in the second configuration in order to maintain the pressure in the space above ambient but below a predetermined maximum pressure.

Preferably the apparatus comprises a pressure sensor for sensing the gas pressure in the duct, the processing element being responsive to the sensed pressure to control the flow regulator to provide the overpressure. This sensor may be part of the flow regulator.

The processing element is preferably configured to control the backpressure regulator to regulate the overpressure level. Again this may be done in a feedback process.

In the method and apparatus of the invention, the apertures may have any shape desired. They may be circular or square or be groove-shaped. In the array they are spaced apart across a surface of the first carrier. The spacing may be the same over the whole first carrier but this need not be the case. The first carrier is preferably planar.

BRIEF DESCRIPTION OF THE DRAWINGS

Embodiments of the invention are described in more detail and by way of non-limiting examples with reference to the accompanying schematic drawings, wherein.

DETAILED DESCRIPTION OF THE EMBODIMENTS

Figure 1:
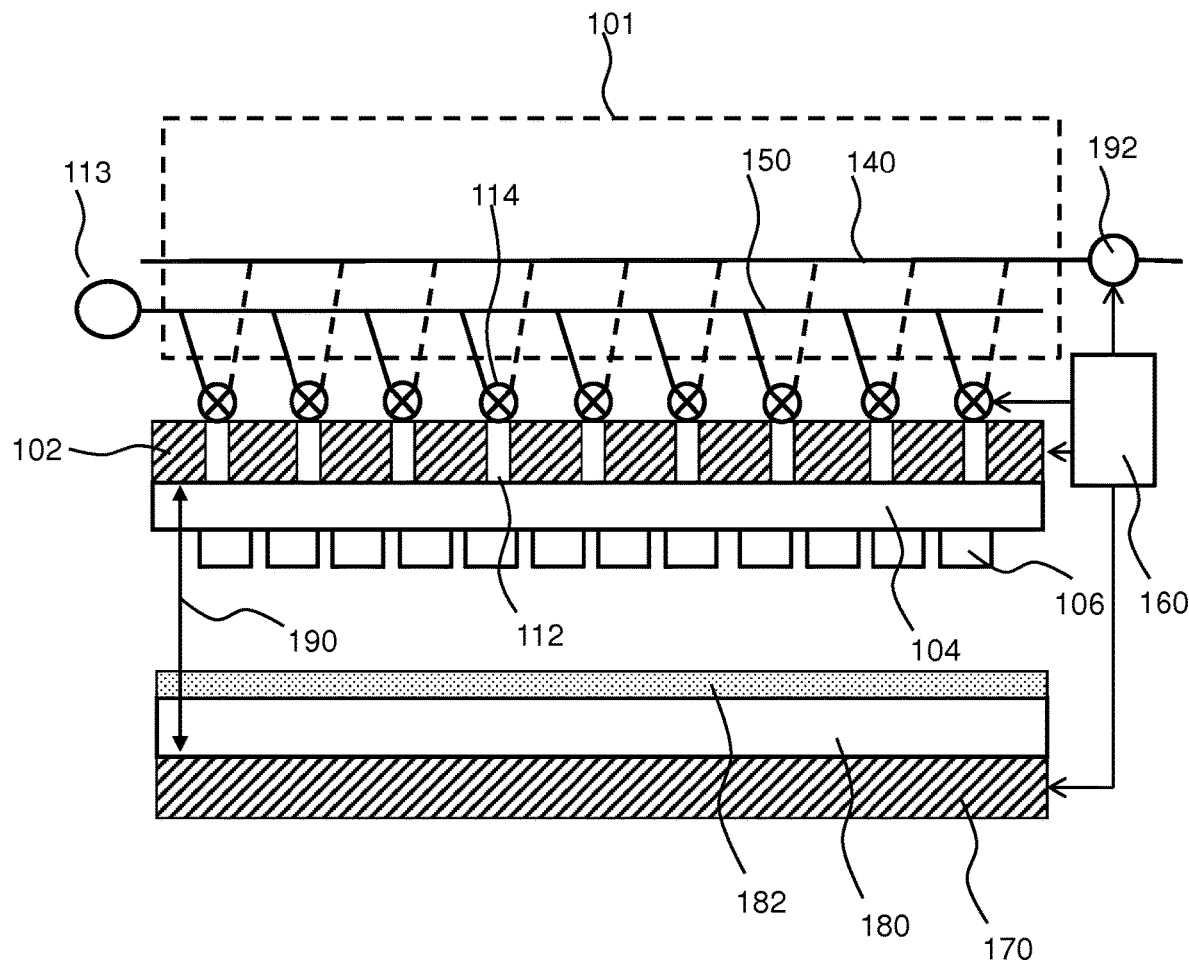
FIG. 1 depicts an imprinting apparatus.

In the description same reference numerals are used throughout the Figures to indicate the same or similar parts.

With reference to FIGS. 1 to 6 a basic imprinting apparatus 100 having a pneumatic system will be described.

FIG. 1 shows an imprinting apparatus 100 in the form of a SCIL imprinting apparatus or any other suitable imprinting apparatus that can be used to transfer an imprinting pattern stamp to a substrate.

The imprinting apparatus 100 typically comprises a first holder or carrier 102 for holding a flexible stamp 104 including an imprinting pattern 106. The imprinting pattern is a relief pattern which can have relief features disposed over its printing surface having width and length dimensions in the order of micrometers or nanometers. The feature size of the imprinting pattern may be any suitable size, and preferably is a nanoscale pattern, that is, a pattern having feature sizes as low as 10 nm up to in excess of 1 mm, with an aspect ratio (vertical dimensions divided by lateral dimensions) of the features may be 8 or higher. It should however be understood that other feature sizes may also be contemplated, and that the present invention equally may be applied to transfer nanoscale patterns having smaller aspect ratios. For instance, at least some embodiments of the present invention are suitable to transfer imprinting patterns with an aspect ratio in the range of 0.001 to 10.

The flexible stamp 104 and imprinting pattern 106 may be realized in any suitable material e.g. a suitable (synthetic) rubber material such as a polysiloxane-based material, e.g. polydimethylsiloxane (PDMS). Typically the rubber stamp is attached to a stamp backplate (not drawn) for example made of thin plastic material, thin glass or thin metal each of which is typically more stiff than the rubber material layer.

The first carrier 102 typically comprises a plurality of stamp engaging elements 112 (only one indicated in FIG. 1 for clarity), which may be arranged in an array or grid along the surface (extending perpendicular to the plane of drawing) of the first carrier. Such apertures 112 are typically arranged to retain a portion of the flexible stamp 106 relative to the first carrier 102 in a first configuration and to release or even push away the portion of the flexible stamp from the first carrier 102 in a second configuration. In this case the stamp engaging elements 112 are embodied by pneumatically operated apertures that can be provided with, and switched between, a holding pressure and a releasing pressure in order to provide the first and second configuration respectively.

As defined herein before, the reference pressure is the pressure present at the relief side of the stamp. Usually when an apparatus is operated in ambient conditions such reference pressure is ambient pressure at around 1 Bar. The holding pressure then is lower than this reference pressure by a specified amount (underpressure) and the pressure difference is then chosen to be sufficient to hold the stamp against the first carrier. For example if the stamp is in a hanging orientation with regard to the substrate then the weight of the stamp must at least be overcome. The releasing pressure is higher than the reference pressure by a specified amount (overpressure) and is chosen to be enough to release or move the stamp away from the first carrier.

Figure 2:
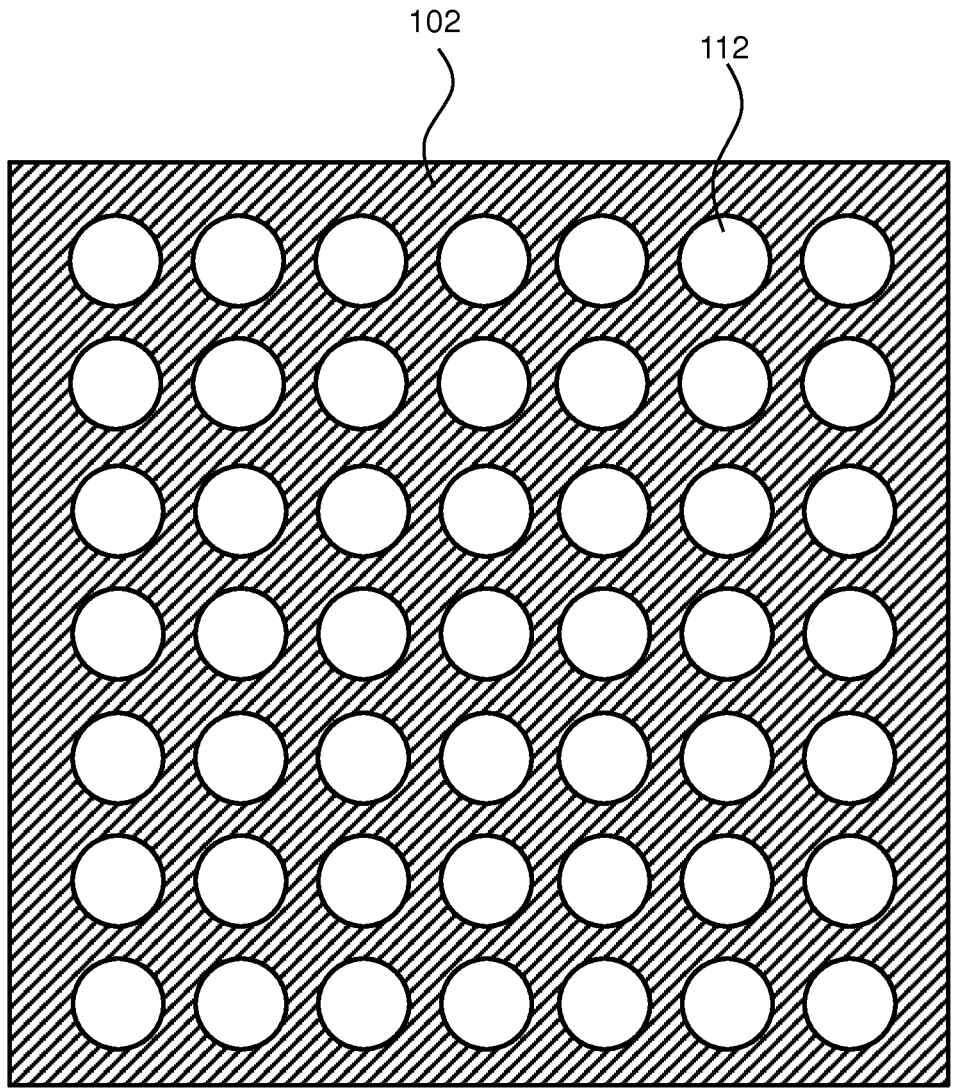
FIG. 2 depicts an example of part of the imprinting apparatus.

The apertures 112 may have any suitable shape. For instance, the apertures 112 may be groove-shaped, with the grooves extending over substantially the whole length (e.g. in the direction perpendicular to the drawing) of the first carrier 102; or the apertures 112 may be circle-shaped, with the apertures 112 defining a two-dimensional grid, as shown in FIG. 2. Other cross sectional shapes will be apparent to the skilled person. Groove-shaped apertures 112 are for instance suitable in case the imprinting direction and the release direction of the flexible stamp are the same or opposite to each other, as will be explained in more detail later. The two-dimensional grid of circular apertures 112 as shown in FIG. 2 for instance is particularly suitable in case the imprinting direction and the release direction of the flexible stamp 104 are different from each other, as will be explained in more detail later.

The apparatus 100 has a pneumatic system 101 for operating the plurality of apertures 112. To this end the pneumatic system has a high pressure duct system 140 having one of its ends 103 connected via a gas entrance 103 to a supply of gas 192 providing a gas to the duct system at a supply pressure. In this case the duct system includes one section in the form of a conduit having multiple openings disposed along the conduit where each one is connected to a respective aperture via a valve 114 (as with the apertures also one valve is indicated for clarity). The duct system is open ended at its other end 115. The pneumatic system also has a low pressure duct system 150 in this case having a single conduit along which openings are disposed each one connected to one of the valves 114. The low pressure conduit is connected to a source of low pressure such as for example a vacuum pump or vacuum vessel (not drawn). In this case a vacuum supply 113, such as a vacuum pump or a reservoir at below ambient pressure, is connected to the conduit 150.

As indicated, each aperture 112 is connected to a valve 114, which in this case is a three way valve, which can switch the aperture 112 to a pressure in the high pressure duct which is to serve as the release pressure or to a pressure of the low-pressure duct serving as the holding pressure.

The connection between each valve 114 and the low pressure duct system (conduit) 150 is shown by solid lines and the connection between each valve 114 and the high pressure duct system (conduit) 140 is shown by dashed lines.

Typically, the pneumatic system is capable of providing a holding pressure which is supplied at about 500 mBar to 900 mBar below the reference pressure (such reference pressure is typically ambient pressure (e.g., 1000 mBar at e.g., room temperature) if the printing process is performed with ambient pressure present between stamp and substrate). More preferably, the holding pressure is between 700m Bar to 800 mBar below the reference pressure, i.e., at about 200-300 mBar absolute pressure when the reference pressure is ambient pressure. In any case other pressures can also be used.

The imprinting apparatus 100 further comprises a second holder or carrier 170 for carrying a substrate 180 to be imprinted. Any suitable substrate 180 may be used, e.g., any suitable semiconductor substrate such as a silicon substrate, a silicon-on-insulator substrate, a silicon germanium substrate, glass, high index glass, sapphire, plastics and so on. The substrate 180 may carry an imprintable layer such as a resist layer 182, which may be any suitable material. For instance, the resist layer 182 may comprise a curable material that may be solidified (cured) to immobilize the imprinting pattern 106 in the resist layer 182. In an example, the resist layer 182 comprises a sol-gel material. A suitable example of such a material is disclosed in WO 2009/141774 A1. Further examples of suitable resist materials for instance can be found in US 2004/0261981 A1, WO 2005/101466 A2, US 2005/0230882 A1, US 2004/0264019 as well as in the non-patent publication Advanced Materials, 1998, Vol. 10(8), page 571 and for example TEOS resists.

The valves 114 are controlled by a controller having a processing element (processor) 160. The processing element 160 typically executes computer program code that instructs the controller how to control the valves 114 and the first carrier 102 during the imprinting process.

The first carrier 102 can also be controlled by the processing element 160 although a separate controller can also be used. To this end, the imprinting apparatus 100 further comprises means for positioning and repositioning the first carrier 102 relative to the second carrier 170 including in three dimensions represented by the three Cartesian coordinates X, Y, Z under control of the processing element 160. Furthermore, there may be provided means for adjusting the relative positions laterally (in a direction parallel to the second carrier 170), vertically (in a direction perpendicular to the second carrier 170) both using translation and orientation. In this example the apparatus includes automated displacement means under control of the processing element 160. The automated displacement means may include for example mechanical or electrical units providing mechanical or electrical feedback mechanisms for precisely controlling the relative XYZ positions and orientation of the first carrier 102 relative to the second carrier 170. Such displacement means are known per se and are therefore not described in any further detail for the sake of brevity only.

The second holder or carrier 170 optionally may also be controlled by the processing element 160 or a controller separate from one or more of the previously described controllers. The controlling can be in a manner analogous to the above control means for the first holder or carrier 102, to increase the degrees of freedom of the imprinting apparatus 100. However, it is equally feasible to provide an imprinting apparatus 100 having a stationary or fixed second carrier 170. Preferably the first and second carrier can at least be moved relative to each other and controlled by one or more of the controllers to this extent.

The first carrier 102 is separated from the second carrier 170 by a gap 190, the size of which may be controlled by the processing element 160, e.g. by engaging the means for positioning and repositioning the first carrier 102 relative to the second carrier 170. In a particular example, the processing element 160 may be programmed to alter the gap size e.g. in between performing an imprinting step and the release step. Specifically, the processing element 160 may be programmed to increase the gap size upon completion of the imprinting step (and after developing the resist layer 182) as increasing the gap size can aid the release of the imprinting pattern 106 from the developed resist layer 182, as will be explained in more detail below.

It will be clear that during a particular imprint process a substrate and stamp with fixed dimensions such as fixed thickness is generally used and that therewith control of the gap 190 translates into control of the distance between substrate and stamp. The substrate thickness and that of any layers of such substrates may be predetermined or determined in-line using methods known in the art.

The forward pressure regulator 192 may be under control of the processing element 160. This for instance facilitates varying the release pressure during an imprinting or release step as will be explained in more detail later.

The imprinting apparatus 100 may have a user interface, e.g. a user terminal including at least one instructions input device such as a keyboard, mouse, trackball, and so on for allowing the user to configure the imprinting apparatus 100 to have its controllers control the apparatus in accordance with a desired imprinting process. It should be understood that any suitable user interface may be used. The user interface may be embedded in the apparatus, but can also be remote and connected via suitable communication network which is either wireless or wired.

As mentioned above, the processing element 160 is arranged to control the first carrier 102, the valves 114 and/or the pressure regulator 142. To this end, the imprinting apparatus 100 further comprises a computer-readable data storage medium (not shown), such as a memory device, e.g. Flash memory, RAM or ROM, a solid state disk, a magnetic disk and so on. The data storage medium comprises computer program code for execution by the processing element 160, which computer program code causes the controller to implement the various steps of the imprinting method to be performed by the apparatus. The data storage medium may be located in any suitable location of the imprinting apparatus 100; the data storage medium may be integral to the processing element 160 or may be a discrete component accessible by the processing element 160 in any suitable manner, e.g. over a data communication bus or a point-to-point connection between the processing element 160 and the data storage medium.

Operation of the device for implementing an imprinting method will now be described. Firstly, the flexible stamp 104 is affixed to the first carrier 102 by switching the apertures 112 to the holding pressure by connecting them to the low-pressure duct and disconnecting them from the high-pressure duct using the valves 114. Additional affixing means may be provided, for instance around an edge portion of the flexible stamp 104, but these are not necessarily needed. Such affixing means may for instance comprise clamps clamping the edge of the flexible stamp 104 to the first carrier 102 although it should be understood that in at least some examples no additional affixing means are being used.

The first carrier 102 is subsequently positioned over the second carrier 170 carrying the substrate 180 coated with resist layer 182, such that the imprinting pattern 106 faces the resist layer 182. The first carrier 102 is typically positioned relative to the second carrier 170 such that a gap 190 exists between the first carrier 102 and the second carrier 170, which gap 190 may be defined by the user of the imprinting apparatus 100 to ensure a good conformal contact between the flexible stamp 104 and the substrate 180 during imprinting. The gap 190 may be chosen in any suitable range; for instance, in a typical SCIL process in which the imprinting pattern 106 is a nanoscale pattern, the gap 190 be chosen in a range to ensure a distance between substrate surface and stamp surface from 10-500 µm, preferably in a range from 20-200 µm, more preferably in the range from 10-100 µm.

Figure 3A:
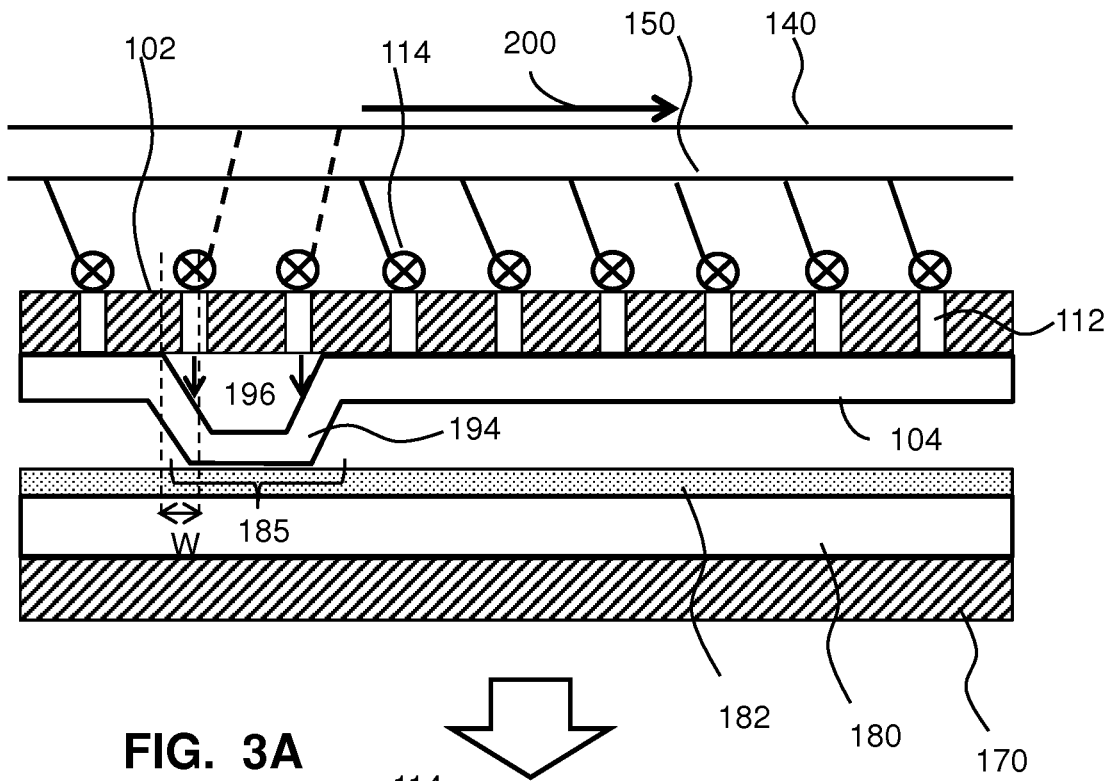
FIGS. 3A and 3B depict an imprinting cycle using the imprinting apparatus.
Figure 3B:
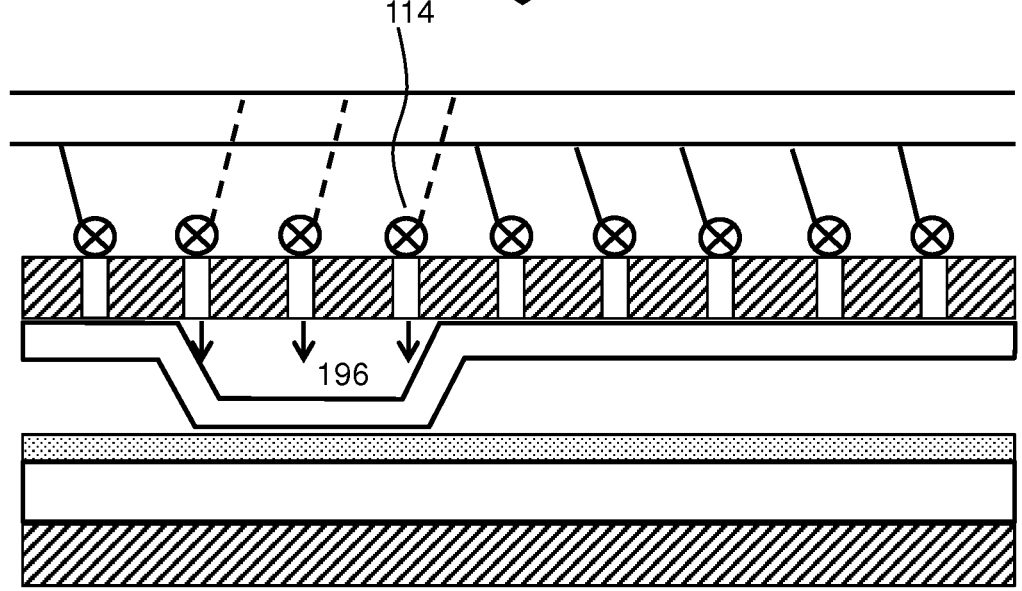

Upon positioning the first carrier 102 relative to the second carrier 170, the imprinting process proceeds with an imprinting step represented with FIGS. 3A and 3B. In FIG. 3A a contact area 185 is created between the flexible stamp 104 and the substrate. This contact area is then gradually expanded as shown with contact area 187 in FIG. 3B, until e.g. the entire imprinting pattern 106 intended to contact the substrate 180 is brought into contact with this substrate. It is noted that in FIGS. 3A and 3B the imprinting pattern 106 has been omitted for the sake of clarity only; this should not be construed as the imprinting pattern being absent.

As can be seen in FIG. 3A, an initial contact area 185 at stamp bulge 194 is created between the flexible stamp 104 and the substrate 180 by individually switching selected apertures 112 from holding pressure to release pressure (e.g. switching apertures from the first configuration to the second configuration). In FIG. 3A, only the selected connections between the valves 114 and the respective duct systems 140 and 150 are shown, for reasons of clarity. This aperture switching bulges part 194 of the flexible stamp 104 away from the first carrier 102 towards the second carrier 170 in order to establish the contact area 185 between the flexible stamp 104 and the second carrier 170 including the substrate 180 carrying the resist layer 182.

The contact area 185 is typically expanded by moving a part of the contact front of the contact area 185 in the direction of the aforementioned arrow by periodically switching the next aperture 112 from the holding pressure to the releasing pressure by controlling its valve 114, as shown in FIG. 3B to arrive at contact Area 187 which is enlarged with regard to the area 185. This process is repeated until the contact area is established over the entire desired area of the substrate 180, i.e. the desired portion of the imprinting pattern 106 has been brought into contact with the resist layer 182.

The rate of expansion of the contact area 185 and 187 is among others determined by the rate at which the next apertures 112 are switched to the release pressure, as well as by the gap 190, but it can be controlled with the rate of switching the apertures. The associated bridge width W where the stamp is not contacted by either the first carrier 102 or the substrate 180 may for instance be chosen between 10 and 50 mm. Other gap sizes can be used. The bridge width, which is mainly a function of the gap size, the bending stiffness of the flexible stamp 104 and the applied pressure, influences the obtainable imprint speed and stamp release speed. A larger gap allows for more substrate total thickness variation (TTV) and makes the gap setting less critical (e.g. more variation allowed, wedge). A smaller gap allows for faster imprinting speeds. By way of non-limiting example, the imprint speed (the delay between switching an aperture 112 from holding pressure to releasing pressure) is ~0.8-1.5 sec. per aperture for a 100 micron gap 190, e.g. 1.92 mm/sec. but can be up to 33 !mm/sec. (0.075 sec. delay) when the gap 190 is 50 micron. Different speeds and different aperture spacings are of course equally feasible.

The rate of switching the apertures 112 to releasing pressure is typically chosen such that it is ensured that a good conformal contact is established between the imprinting pattern 106 and the substrate 180. Such good conformal contact is for instance achieved when the switching rate is chosen such that it allows the portion of the flexible stamp 104 to contact the substrate 180 to be pulled into the resist layer 182 by capillary forces originating from recesses in the imprinting pattern 106 of the flexible stamp 10, or onto a dry substrate 180 by Van der Waal's forces.

The processing element 160 may be adapted to vary the rate at which apertures 112 are switched to the overpressure depending on certain process parameters, as will be explained in more detail below. This can significantly reduce the duration of the imprinting step compared to earlier imprinting methods, in which this rate is typically constant during the imprinting step and based on a worst case scenario. In contrast, in accordance with at least some examples described here, it has been recognized that this rate can be increased during certain phases of the imprinting step, thereby reducing the overall duration of this step.

Once the desired contact area between the imprinting pattern 106 and the substrate 180 has been established, the resist layer 182 is subsequently developed, e.g. cured or solidified, in any suitable manner, for instance by exposure to an external stimulus such as UV or visible light, heat and so on. This development is done so that the inverse of the imprinting pattern 106 is immobilized in the developed resist layer 182.

At this stage the gap 190 may be adjusted, i.e. increased, in order to reduce the duration of the release step in which the imprinting pattern 106 is released from the developed resist layer 182. Depending on the type of imprinting pattern 106 and resist layer 182, the stamp 104 can be attached to the imprinted developed resist layer 182 by a relatively high contact area, and thus force. The release force that can be generated is higher for larger gaps 190. For instance, it is possible that a stamp 104 cannot be released from the developed resist layer 182 if the gap 190 is set to 50 micron, but can be released if this gap is 100 micron. This is due to the way the stamp is released, which as explained in more detail with the aid of FIGS. 4A and 4B.

Figure 4A:
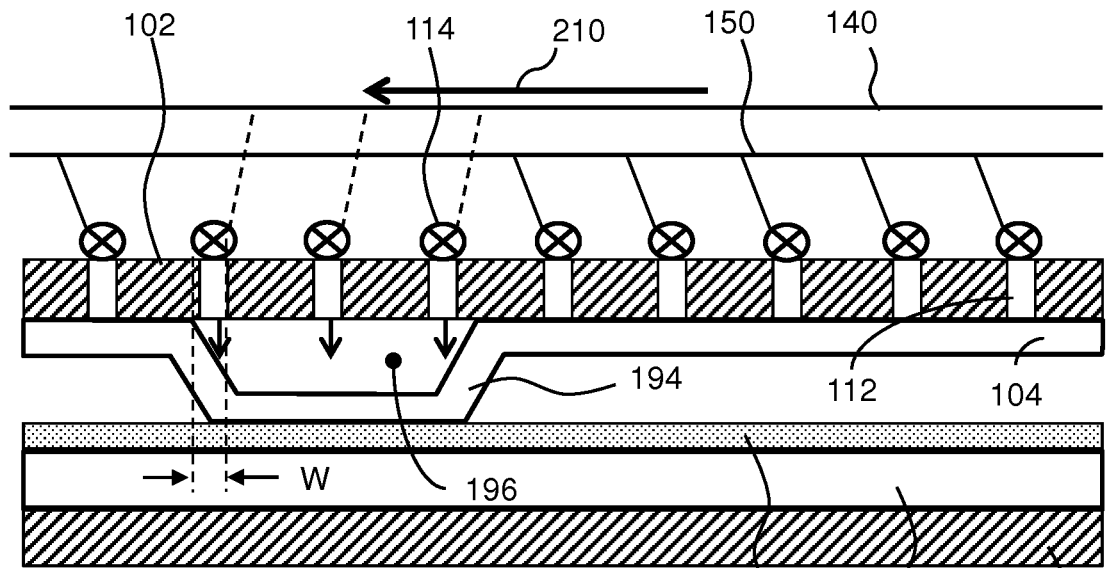
FIGS. 4A and 4B depict a release cycle using the imprinting apparatus.
Figure 4B:
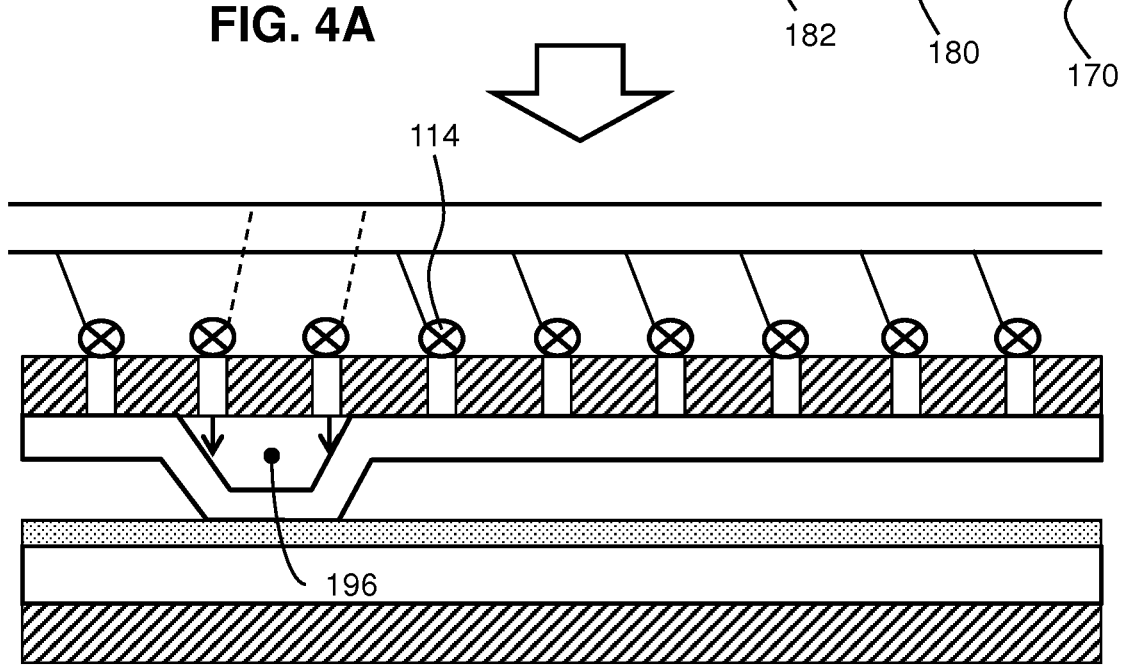

During this release step, individual apertures 112 are switched from releasing pressure of duct system 140 to holding pressure of duct system 150, which causes the flexible stamp 104 to move towards the first carrier, i.e. the flexible stamp 104 is as it were peeled away from the developed resist layer 182. Upon arriving of portion of the stamp at the first carrier near an aperture that has just been switched to the holding pressure, the aperture is sealed by that portion and in this process the bridge length W is shortened by one aperture pitch. This increases the force on the contact surface 187 and as more apertures 112 are switched to holding pressure causes to displace the contact front of the contact area 187 in the direction of the horizontal arrow 210 to arrive at contact area 185, as shown in FIGS. 4A and 4B. Thus, the bridge is further shortened until the force is equal to the release force of the imprinting pattern 106 of the flexible stamp 104 from the developed resist layer 182 on the substrate 180 carried by the second carrier 170. This then relaxes by release of the stamp. With a larger gap 190, the forces normal to the substrate wafer are higher, thereby easing the stamp release. Also, the longer bridge length caused by this larger gap 190 allows more force to be applied before the holding pressure seal is lost between the portion of the stamp 104 and the apertures 112 of the first carrier 102 holding the flexible stamp 104 in place, e.g., the apertures 112 in contact with the outer edge of the flexible stamp 104.

At this point it is noted that during stamp release from the substrate, the flexible stamp 104 is in equilibrium with the force required to release the stamp. The next aperture 112 can only be switched to holding pressure after a portion of the flexible stamp 104 (on average) has released that has a size comparable to an aperture-to-aperture distance. Consequently, the rate of release of the flexible stamp 104 from the substrate 180 will be determined by the gap setting as well. For the example, if a flexible stamp 104 can be released using a gap of 50 and 100 micrometers, the release speed for a gap of 100 micrometers will be higher than that of a 50 micrometer gap, such that a higher release rate, i.e. the rate at which individual apertures 112 are switched to the holding pressure along the direction indicated, can be applied by periodically switching the corresponding valves 114 to the holding pressure of low-pressure duct system 150. For the highest throughput of the overall imprinting process, the gap 190 setting for the imprinting step may be different from the gap 190 required for optimal stamp release during the release step shown in FIGS. 4A and 4B.

The processing element 160 is preferably adapted to vary the rate at which apertures 112 are switched depending on certain process parameters, as will be explained in more detail below. This can significantly reduce the duration of the release step compared to earlier imprinting methods, in which this rate is typically constant during the entire release step and based on a worst case scenario. It has been recognized that this rate can be increased during certain phases of the release step, thereby reducing the overall duration of this step.

Figure 5A:
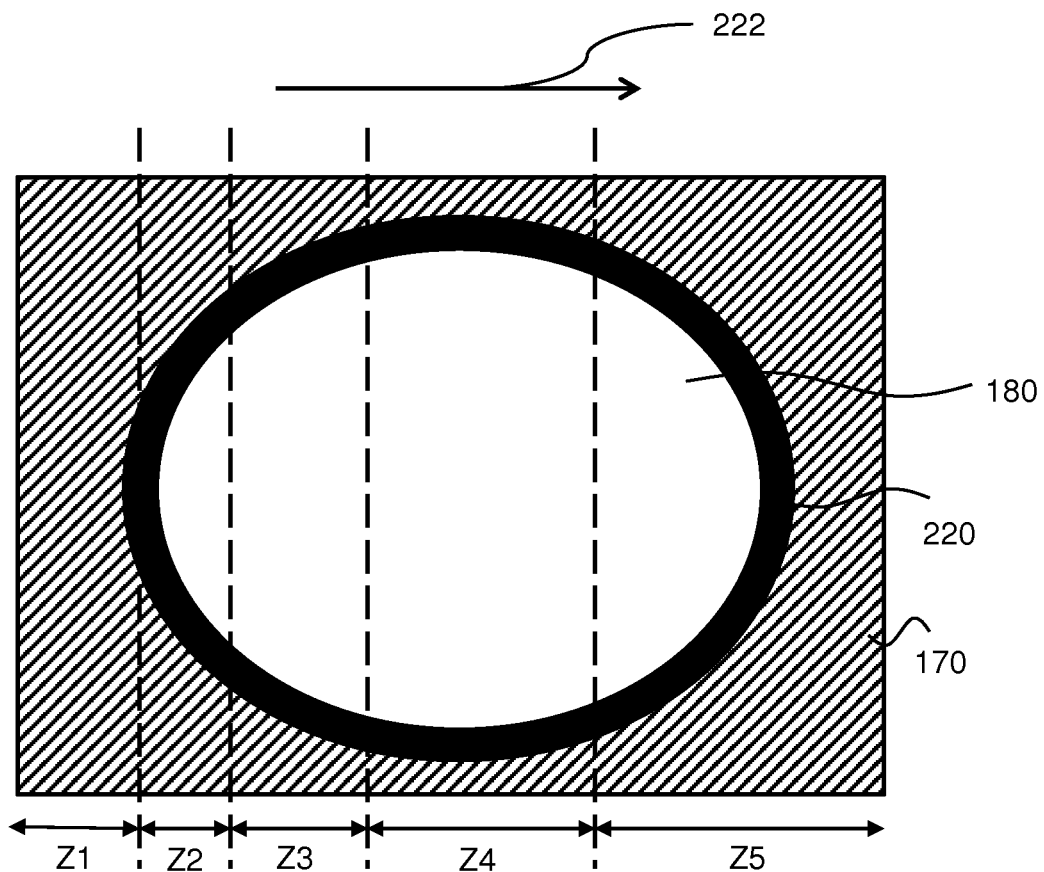
FIGS. 5A and 5B depict an imprinting process using the imprinting.
Figure 5B:
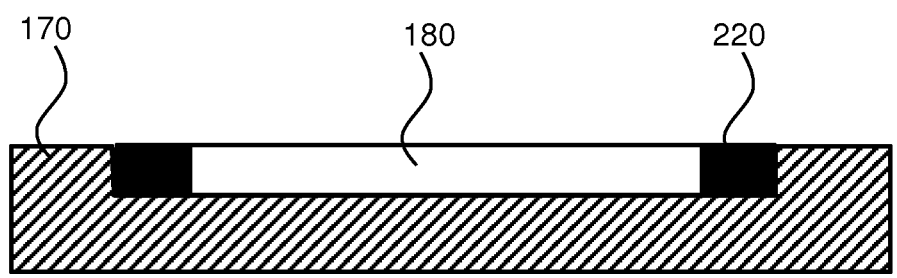

A first set of possible scenarios during which the rate of expansion of the contact area may be varied during the imprinting step is shown in FIGS. 5A and 5B, which depicts a top view (top pane) and a cross section (bottom pane) of the second carrier 170. It should be understood that FIG. 5 combines several examples as will be explained in more detail below, which examples however may be equally applied in isolation. In FIG. 5, the second carrier 170 comprises an edge portion 122, which typically is an edge delimiting a region in which the substrate 180 is to be placed. In other words, the edge portion 220 functions as a holder for the substrate 180. In FIG. 5, the edge portion 220 is shown to have the same height as the substrate 180 by way of non-limiting example only. It should be understood that the edge portion 220 may have a different height from the substrate 180, in particular a lower height such that the edge portion 220 does not interfere with the contact between the flexible stamp 104 and an edge region of the substrate 180 adjacent to the edge portion 220 during the imprinting process. The rate at which the contact area may be expanded during the imprinting step shown in FIG. 3 may be varied depending on which zone or region of the second carrier 170 the contact area is expanded into.

FIG. 5 identifies five different zones, labeled Z1-Z5. The imprinting process typically starts by establishing an initial contact area between the flexible stamp 104 and the second carrier 170 in region Z1. To this end, the region Z1 may optionally comprise one or more alignment markers (not shown) for correctly aligning the first carrier 102 relative to the second carrier 170. As the quality of the contact between the flexible stamp 104 and the second carrier 170 is not crucially important in this region, the contact area in region Z1 may be established at a relatively high rate, i.e. the delay between switching subsequent apertures 112 to releasing pressure may be relatively short.

Upon the contact front of the contact area reaching region Z2, contact between the flexible stamp 104 and the substrate 180 is initiated. At this point, it is important that a good conformal contact between the flexible stamp 104 and the substrate 180 is established, and that the inclusion of air bubbles in this part of the contact region is avoided. Consequently, it is desirable that upon reaching region Z2, the rate of expanding the contact region by periodically switching the next in line aperture 112, in the direction of the horizontal arrow 222, to the releasing pressure by control of the corresponding valve 114 is appropriately reduced. Optionally, the releasing pressure applied by the selected apertures 112 may be temporarily increased whilst the contact front of the contact area travels through region Z2 to further improve the contact between the flexible stamp 104 and the substrate 180 in this region. This may be achieved by the processing element 160 configuring the pressure source 192 accordingly at this stage of the imprinting step. It is noted that this increase in releasing pressure may increase the leakage through at least some of the apertures 112 that are switched to holding pressure, which can reduce the fixation strength of the flexible stamp 104 to the first carrier 102. However, this is a negligible problem as long as the contact area is relatively small.

Upon the contact front of the contact area 194 expanding into region Z3, the conformal contact between the flexible stamp 104 and the substrate 180 has become well-established, such that at this point the expansion rate of the contact area may be increased again, i.e. by increasing the rate at which the valves 114 of the next in line apertures 112 are switched to the releasing pressure channel 140. At the same time, it is preferable to reduce the releasing pressure to its initial value by the processing element 160 controlling the supply pressure at 192 accordingly in case this releasing pressure was temporarily increased as previously explained. The expansion rate is typically increased when a predetermined amount of the contact area has made contact with the substrate 180. The predetermined amount may be determined through experimentation and will typically depend upon the materials used, such as the material of the flexible stamp 104 and the resist layer 182. During the imprinting step, this higher rate may be maintained until region Z5 is reached.

Similarly, during the release step the forces that have to be overcome to release the flexible stamp 104 from the developed resist layer 182 gradually increase from the edge towards the center of the substrate 180. Consequently, the rate at which holding pressure is applied to selected apertures 112 in order to gradually reduce the contact area between the flexible stamp 104 and the developed resist layer 182 may be reduced in central region Z4 compared to edge regions Z3 and Z5.

At this point it is noted that the variation of the contact area reduction rate, i.e. the rate at which apertures 112 are switched to holding pressure, in outer regions Z3 and Z5 compared to central region Z4 may be independent of the variation of the contact area expansion rate, i.e. the rate at which apertures 112 are switched to releasing pressure, in regions Z1-Z3. In other words, these variations are independent embodiments of the present invention, which embodiments optionally may be combined with each other.

Figure 6:
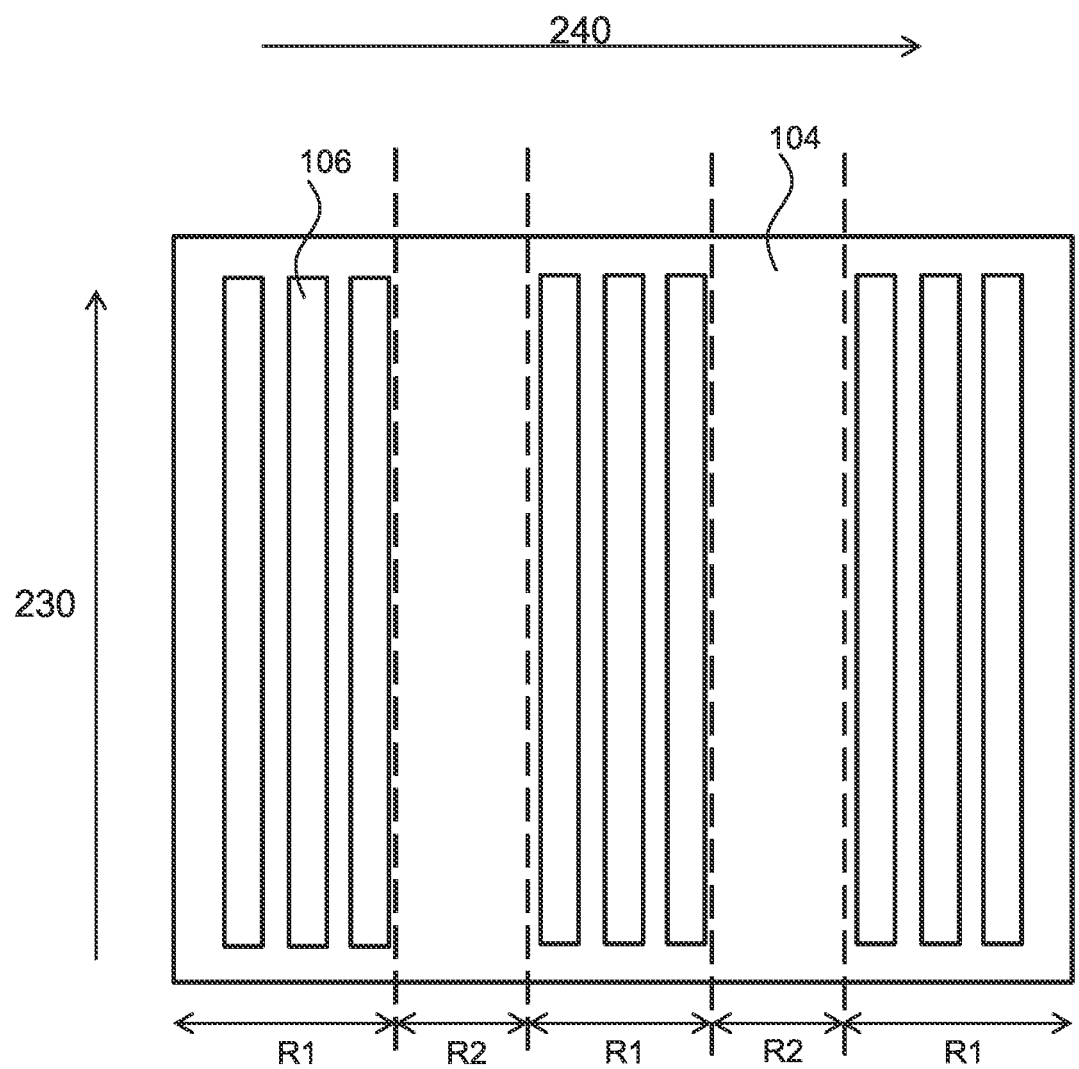
FIG. 6 depicts another imprinting process using the imprinting apparatus

FIG. 6 schematically depicts a flexible stamp 104 having an imprinting pattern 106 with regions having different feature densities. In FIG. 6, a first region R1 having a high feature density and a second region R2 having a low feature density (e.g. no features) are shown by way of non-limiting example; it will be immediately understood by the person skilled in the art that a typical flexible stamp 104 may comprise many different regions characterized by different feature densities. It should be understood that FIG. 6 combines several examples as will be explained in more detail below, which examples however may be equally applied in isolation.

It has been recognized that in case a flexible stamp 104 comprises an imprinting pattern 106 having such different regions with different feature densities, the rate at which individual apertures 112 are switched to holding pressure to release the imprinting pattern from the developed resist layer 182 may be varied in accordance with these different regions. In particular, regions R1 having a relatively high feature density exhibit a higher contact area between the corresponding features of the imprinting pattern 106 and the developed resist layer 182, which means that a higher force will be required to release region R1 of the flexible stamp 104 from the developed resist layer 182. Consequently, this region is preferably released at a lower rate than regions R2 in order to ensure that the flexible stamp 104 is released from the developed resist layer 182 without adverse effects.

Optionally, the releasing pressure applied to the apertures 112 not (yet) switched to the holding pressure may be reduced during the release step, as this will result in less leakage and therefore a better vacuum for the apertures 112 switched to the holding pressure. This creates a higher release force which in particular will help in releasing the flexible stamps 104 with high aspect ratio imprinting patterns 106.

For certain types of imprinting patterns 106, the direction in which the contact front of the contact area 194 is moved forward during the imprinting step may be different from the direction in which the contact front of the contact area should be released from the developed resist layer 182 during the release step. In this context, a different direction is intended to mean that the path the contact front follows during the release step is different to the path the contact front follows during the imprinting step; in other words, a different direction does not include the reverse of the direction of the imprinting step.

A non-limiting example of such an imprinting pattern, in which the elements of the pattern have asymmetry, for example they are not rotationally symmetric, is a grating, which is schematically depicted in FIG. 6. In order to take full benefit of the capillary forces that assist the formation of the conformal contact between the flexible stamp 104 and the substrate 180, the imprinting step should be performed in parallel with the grating lines, in the direction of the arrow 230. In contrast, the release of the imprinting pattern 106 from the developed resist layer 182 can be more easily achieved when releasing the imprinting pattern 106 from the developed resist layer 182 in a direction, shown by arrow 240, perpendicular to the grating lines (the shaded lines in regions R1 of FIG. 6). Other examples of imprinting patterns for which such a different direction between imprinting and release is beneficial will be apparent to the skilled person. As previously explained, such multidirectional imprinting and release may be facilitated by a first carrier 102 as shown in FIG. 2.

In performing the above described imprinting processes it was observed by the inventor that optimization of speed of imprint and stamp release cycles gave an uncontrolled variation in the quality of imprints obtained. It was recognized that in order to reduce such variations the control of airflow during the imprint cycle and/or the release cycle should be improved. In this respect attention is drawn to the fact that during the imprint cycle and the release cycle there exists a space 196 (which is enclosed by the stamp and the first carrier) is formed between the first carrier 102 and the flexible stamp 104. In this space a release pressure is present as it is connected to apertures having a release pressure (apertures in second configuration). In addition, this space thus short-circuits the second configuration apertures with respect to their release pressures. In connection with this it was thus in particular recognized that a high airflow rate towards each aperture 112 is required in the imprint cycle to remove the previous holding pressure (which is a low pressure) and to maintain the newly pressurized space 196 between the first carrier and the flexible stamp (as shown in FIGS. 3 and 4) at the releasing pressure. After all, any lowering of the releasing pressure in this space 196, due to inadequate inflow of gas during switching of apertures from holding pressure to releasing pressure, would risk disturbing the smooth stamp contact due to capillary and/or van der Waal's forces. It has also been recognized that pressure pulses caused by the pressure switching are introduced that need to be minimized.

Such disadvantageous effects were especially apparent with an apparatus in which the high pressure duct system 140 is a closed system in the sense that it does not allow gas flow in a situation where all apertures' valves would be closed. For example, the duct 140 in FIG. 1 would be closed off at its left end. It was recognized that in this case inflow of the systems gas to the apertures is limited by the supply of the gas supply only and this leads to dips in the releasing pressure during switching of apertures 112 in the imprint step and thus under the stamp 104 in space 196, sometimes even to pressures below atmospheric pressure, which is not desired as in effect the stamp may then be released from the substrate.

An open ended system, which provides a continuous gas flow through the high pressure duct system 140 from the supply of pressurized gas through to a gas outlet of the high pressure duct (example given at the left side of the one in FIG. 1) to e.g. the atmosphere, was found to work better in the sense that much weaker pressure waves were observed during the imprinting cycle aperture switching, which led to a much more stable pressure in the space 196 under the stamp during the imprinting process. However, it proved difficult to maintain a significant release pressure above the reference pressure especially in apertures connected to the duct near to the open end which was at reference pressure.

Furthermore, despite the fact that this high airflow mechanism works well for the imprinting of the stamp application into a resist layer, it was found by the inventor that it strongly hinders the stamp release from the cured resist layer. In particular, as an aperture switches from release pressure to holding pressure it draws in a high volume of air from the space 196, which short-circuits all the (open) apertures in the release pressure configuration which together can supply a large volume of gas from the high pressure duct system (having available a continuous flow of gas) to the low pressure duct system air. This not only leads to a degradation of the holding pressure in the low-pressure duct system, but slows down the closing of each aperture during the pulling of the stamp towards the first carrier, leading in turn to more leakage of gas through the open apertures and the weakening of the holding pressure. Eventually the holding pressure may even become insufficient and the release of the stamp from the substrate by the sequential separation process is not possible any more.

Having noticed this, it was also recognized that completely closing the air supply to the stamp 104 on the release cycle is also not workable, as the whole space 196 adjacent the stamp may be degassed to be provided with holding pressure (i.e. a pressure below the reference pressure), leading to uncontrolled release (sequential or not) of the stamp possibly destroying the stamp and/or imprint patterns.

To reduce one or more of the above problems and therewith provide a better operating window for imprint in terms of quality of imprint and/or throughput, the pneumatic system of the imprint apparatus 100 of FIG. 1 is configured with features that allow improved pressure and gas flow control in one or more of the imprint and release cycles during an imprint process.

FIG. 7 again shows the apparatus of FIG. 1 in more detail in that it now shows the additional features for improved pressure and flow control as explained below.

To control the high pressure duct supply pressure to desired levels the duct is connected to a forward pressure regulator 708. In this case the forward pressure regulator is a pressure reducing regulator which reduces a higher supply pressure at its inlet (from a high pressure supply source) down to a regulated lower pressure at its outlet (downstream) which is connected to the gas entrance of the high pressure supply duct. The forward pressure regulator can be part of the gas supply as with gas bottles having a pressure reducing regulator, but can also be part of the pneumatic system of the apparatus. In that case a simple high pressure gas supply need be connected to the regulator inlet.) The regulator 708 in this case provides a reduction of a gas source 710 pressure of e.g. higher than 2 Bar, or higher than 3 Bar or even higher than 5 Bar to a suitable supply pressure (delivered to the high-pressure duct system). If the imprinting apparatus is operated at a reference pressure such as ambient pressure of 1 Bar, then the regulator 708 is configured to be able to control a suitable supply pressure of higher than any one of the following values: of 5 mBar, 10 mBar, 20 mBar, 50 mBar, 100 mBar, and 200 mBar. Preferably however this supply pressure is no more than 500 mBar higher than the reference pressure. A desired supply pressure is 80 mBar higher than the reference pressure. Preferred reference pressure is higher than or equal to 1 Bar, or higher than or equal to 1.5 Bar, or 2 Bar. Most preferred is 1 Bar in which case a good supply pressure is between 1.05 and 1.1 or between 1.05 and 1.08 Bar.

The high pressure duct system 140 is further connected at one end to a pressure regulator 702 for regulating a pressure in the duct system (i.e. upstream of itself) to be higher than a minimum pressure while at least periodically allowing a gas flow through the duct system. In the shown example this pressure regulator 702 is a backpressure regulator, but other such regulators that provide the same function (e.g. relief valves can be used). A back pressure regulator is a device that maintains a defined pressure upstream of itself, i.e. at its own inlet which in this case is connected to the outlet of the high pressure duct system. When gas pressure exceeds the set pressure point of the regulator, the valve opens more to relieve the excess pressure. The regulator preferably relieves into the environment (ambient space), but can also relieve in a closed system if needed. Back pressure regulators thus work similarly to relief valves, but the emphasis is on steady state pressure control (which is preferred for the imprinting apparatus) instead of the more on/off actuation provided by the relief valves.

The regulator 702 is preferably suitable for controlling a pressure in the high pressure duct to a reference pressure plus any one of the following over pressure levels: 5 mBar, 10 mBar, 20 mBar, 30 mBar or 50 mBar.

Having the regulator 702 in combination with a supply pressure allows to have a pressure in the high-pressure duct system to be between a set regulator pressure value and the supply pressure while a gas flow is at least temporarily allowed through the duct from the source to the regulator 702. This is achieved as long as the regulator pressure set at 702 is below the supply pressure and higher than the reference pressure. In such case the pressure supply tries to keep the pressure in the duct at its set point while the regulator 702 tries to maintain a lower pressure by venting gas from the high-pressure duct system until the pressure in the duct system reaches the lower set level at the regulator 702.

Preferably the regulator pressure is set at a pressure value that is the reference pressure plus an overpressure of 5 mBar to 50 mBar. Preferably this regulator 702 pressure is regulated with an overpressure within the range of 10 to 30 mBar.

A useful combination of settings of supply pressure and regulator pressure are the following: supply pressure at 80 mBar higher than reference pressure and regulator pressure at 10 or 20 mBar higher than reference pressure.

The backpressure regulator senses pressure in the duct 140. However a regulator combined with a separate pressure sensor sensing the pressure in the high pressure duct may be used. The sensor data can be used to adjust the regulator setting according to the sensed pressure. This can be controlled by the controller and thus processing element which may include adjusting a regulator valve setting to open or close to obtain the required pressure. For example, a feedback control may close the backpressure regulator whenever it senses that the pressure is below 50 mBar overpressure or below 20 mBar or below 10 mBar, to allow for pressure drops between the duct 140 and the apertures.

The cooperation of the pressure regulator 702 which is controlled to regulate the pressure throughout the duct 140 will cause that the apertures 112 will be at about 20 mBar overpressure, or in the range of 10-30 mBar overpressure, and certainly above the reference pressure.

The effect of the pressure control in the high pressure duct is that during switching from holding pressure to releasing pressure of apertures during the imprint cycle a high gas flow is present at overpressure. In effect the duct is in contact with the outside world, albeit in a regulated way. This reduces the pressure waves during imprint cycle switching, while at the same time, the gas flow is limited during the switching of the apertures from releasing pressure to holding pressure. After all, when the pressure in the apertures at the release pressure drops below the regulator pressure set at the regulator 702, the regulator closes as it does not allow gas flow from the outside to inside the duct as was the case with the open ended system.

The forward pressure regulator 708 and or the regulator 702 may be controlled by a controller such as the one having processing element 160 for setting or controlling the respective pressures.

Despite the closing of the regulator at release cycle switching, there still is a high gas flow provided by the source as the supply pressure regulation tries to supply gas to restore pressure drops in the duct.

Therefore, in a further embodiment, the apparatus and/or pneumatic system further includes a flow regulator 706 connected in series between the plurality of apertures and the gas supply. The flow regulator 706 may also be controlled by the controller having the processing element 160. The flow regulator preferably is between the pressure regulator 708 and the plurality of apertures.

The flow regulator 706 may be an adjustable diaphragm or adjustable valve providing different gas flow openings that can be set at continuously varying or discretely varying steps. More sophisticated versions are capable of maintaining a predefined gas flow rate (some near constantly) and mostly independent form the prevailing input pressure. When incorporated in the imprinting apparatus, during the imprinting cycle a relatively large flow rate to the duct 140 is set during an imprinting cycle. The relatively high pressure and high flow rate avoid the previous problems of pressure cross-talk and pressure waves along the flexible stamp 104 during the imprint cycle as described herein before.

At the same time in the release cycle, the flow rate can be reduced using the flow regulator 706. It is noted that indeed during the release cycle the pressure settings in the high pressure duct may be set to reduce flow rates already. For example, in such cycle the overpressure in the apertures and thus spaces 196 (shown in FIGS. 3 and 4) is controlled to be above reference pressure (e.g. ambient pressure) but below a maximum level (lower than during the imprint cycle) which is for example 20 mBar overpressure, but may be in the range 5-30 mBar, preferably 15-25 mBar overpressure. Thus, the system pressure in the duct 140 may be lowered e.g. to 10 mBar overpressure. However, this still provides a non-desired high gas flow from source to apertures and therewith space 196 during release cycle aperture switching. and this is effectively controlled by using the flow regulator 706 to reduce the flow further. This flow control by the flow regulator places a limit on the flow of air through the apertures 112 into the space 196 and the holding pressure line 150 and the weakening of the holding pressure supplied, whilst ensuring an efficient progressive release of the flexible stamp. The flow rate of the high pressure duct at release cycle may be reduced with respect to the value at the imprint cycle by any one of at least 10%, at least 20% at least 40% at least 80%.

Due to the lower pressure in the overpressure line 140 in the release cycle, the flow is reduced, as leakage through the underpressure line 150 is determined by the pressure difference and by the shape of the stamp. A lower pressure allows for a greater distance across the flexible stamp between where the stamp contacts the first carrier 102 and where it contacts the resist layer 182, i.e. the width of the portion of the stamp that is temporarily stretched to extend across the gap 190. This reduces the angle of this portion to the normal to the plane of the carriers 102 and 170 and leads to a smaller gap between the surface of the stamp and the first carrier, adjacent to the evacuated aperture. The smaller gap is easier to close, thus reducing leakage to vacuum.

To summarize the effects achieved with the invention: in the imprinting cycle there is a high flow rate with minimal pressure variations, and a pressure next to the stamp that is kept higher than reference pressure (e.g. ambient); and in the release cycle there is a low flow rate, preferably in combination with a reduced pressure compared to the imprinting cycle, and a pressure in the space 196 next to the stamp that is kept slightly above ambient (except for a small region next to one aperture when it is first opened to the underpressure line, to pull in the stamp).

In an alternative embodiment, the imprint station comprising the substrate 180 and the second carrier 170 could be brought into a pressurized compartment, held at a reference pressure higher than 1 Bar, e.g. 2 Bar. This would still enable an imprinting cycle with an overpressure of 20 mBar (2.020 Bar absolute), but on the release cycle a pressure difference of 2 atmospheres would become available. This would allow a drastically improved pressure difference on the stamp release cycle. The first carrier is separate from the second carrier, so the imprinting cycle can still be carried out close to ambient pressure, but once the stamp is in full contact with the substrate 180 the pressure can be increased around the stamp to 2 atmospheres, while the pressure under the grooves is at the same time increased to 2+0.020 atmospheres. Then the release cycle can be started using a much improved pressure difference from the pressurized grooves/ stamp area towards vacuum, e.g. 2 atmospheres instead of a maximum of 1 atmosphere. This has the further advantage that the loading of the liquid resist coated product 182 can be done under ambient pressure and the maximum holding force due to a pressure difference on the substrate by the chuck vacuum (i.e. the pressure applied to the second carrier 170 to hold the substrate in place) can be set from 0 up to 2 atmospheres.

In the modification described above, the effective ambient pressure, near the stamp, can be above atmospheric pressure, for example it can be 2 Bar. The claims are intended to be interpreted to cover this modification, where they refer in particular to ambient pressure.

All above mentioned implementations can be implemented passively, e.g.

using one fixed setting for the imprinting cycle and one fixed setting for the release cycle. The more advanced implementation, as described above, is to use the processing element 160 actively to control the settings of the flow/ imprint pressure during the imprinting and release cycles. Parameters that could be monitored by the processing element comprise:

flow through the vacuum supply on the underpressure line 150 (if increased flow is detected, this could be compensated by reducing pressure or increasing flow restriction on the overpressure line 140);

pressure next to the stamp in the space 196 (this can be regulated by controlling the pressure or flow on the overpressure line 140);

pressure in the underpressure line 150 (vacuum supply) adjacent the valves 114 (if increased pressure is detected, this could be compensated by reducing pressure or increasing flow restriction on the overpressure line 140).

A combination of flow restriction and pressure adjustment can be used to advantage, or just one of these can be used.

As described above, the switching unit comprise valves and these may be part of the pneumatic system and/or the first carrier. Two-way valves 114 may be used. One of such valves being between each of the apertures and the high pressure duct and one between each of the apertures and the low pressure duct system. Thus each aperture is thus connected to two valves. Alternatively the two valves per aperture may be combined in one valve per aperture where this one valve is at least a three way valve.

Figure 7:
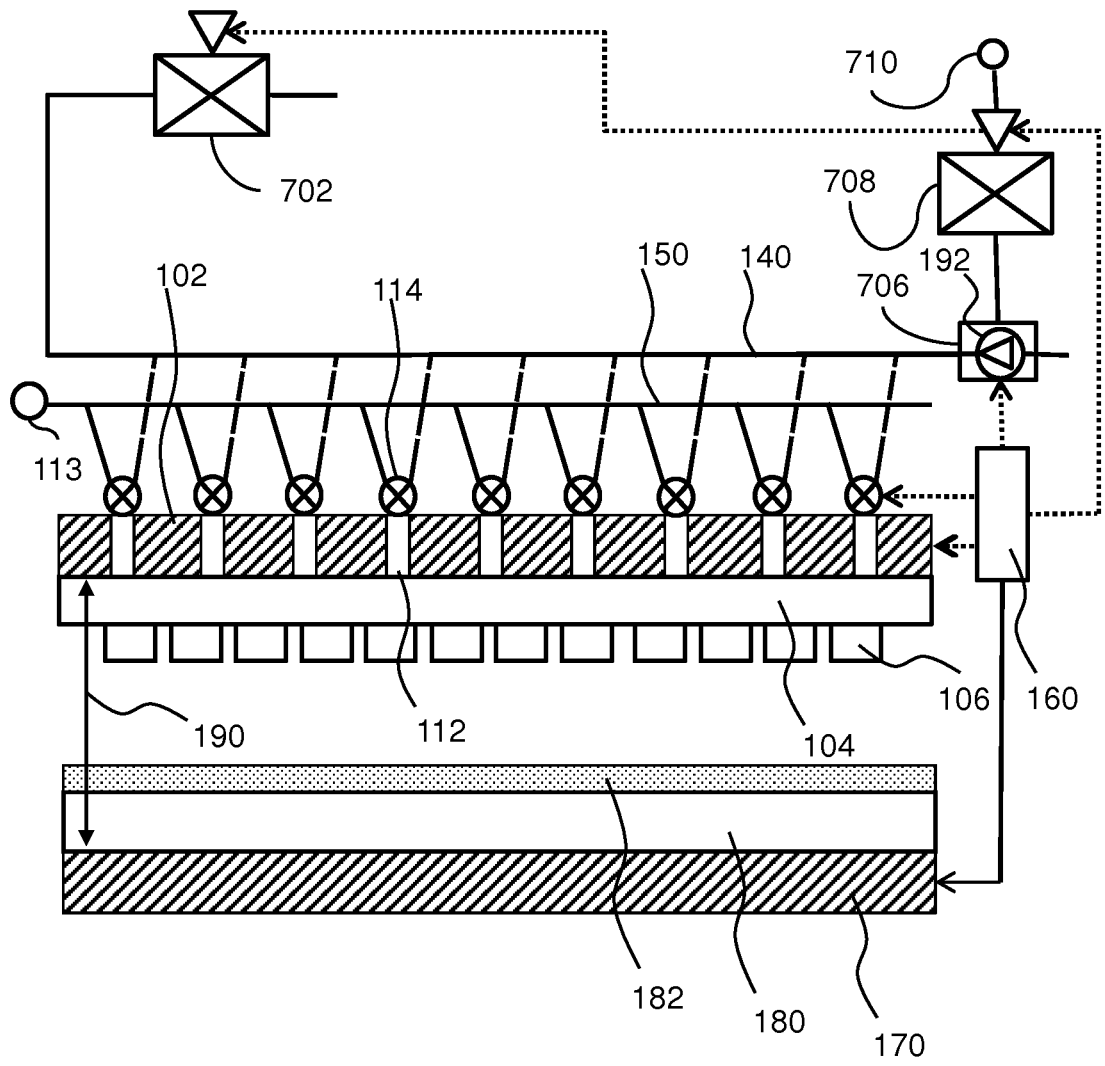
FIG. 7 depicts imprinting apparatus in more detail showing the pressure and flow control of the apparatus.
Figure 8:
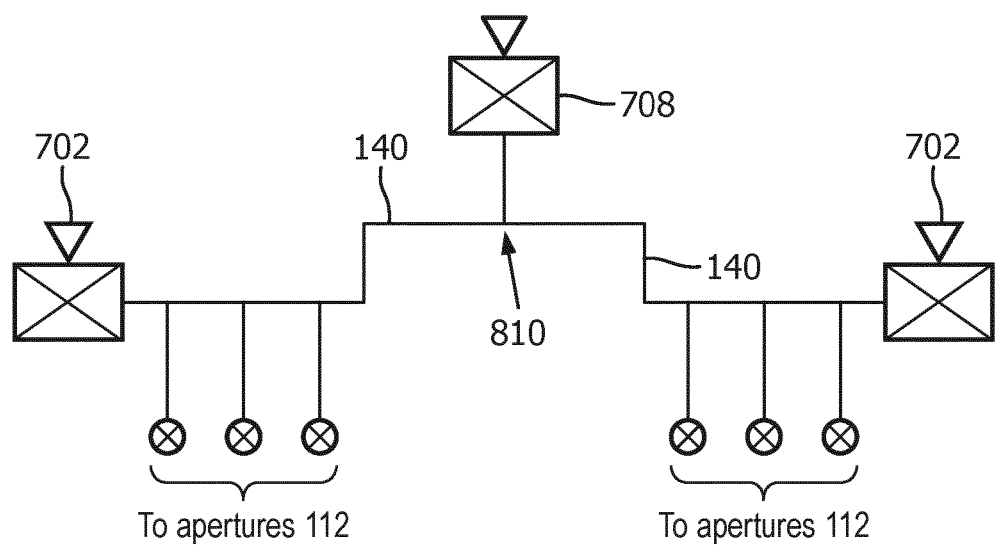
FIG. 8 depicts an alternative high pressure duct system including two ducts each having apertures and a pressure regulator.

FIG. 7 shows a pneumatic system in the apparatus where all of the apertures are connected to one high pressure duct (or conduit) in series between the pressure supply and the pressure regulator 702. Moreover, in the embodiment including the flow regulator the aperture connections are between the pressure regulator 702 and flow regulator. This ensures that pressure and flow can be regulated in all of the plurality of apertures. Only one regulator, pressure supply and flow regulator are needed giving a cost effective solution.

A slightly different configuration still using the minimum amount of such regulators and pressure supplies uses a parallel connection of the apertures between the respective regulators. In such case there is a high pressure duct system having a plurality of high pressure ducts each one between the pressure regulator 702 and the pressure source or the flow regulator if present. Each duct then has at least one aperture connected to it.

In a further alternative there are multiple ducts in the high pressure duct system each of which is connected to a pressure source (can be the same but this need not be so) or a flow regulator (can be the same but may be different ones) if present. There are now multiple pressure regulators each connected to at least one and preferably one duct of this system of ducts. Such a system is more expensive, but allows more precise regulation of the pressures and/or the flows as there are less ducts per pressure regulator 702.

There may be one fixed pressure supply is for use in the imprinting cycle and the other, at a lower fixed pressure, is for use in the release cycle.

As discussed above, embodiments make use of a processing element 160. The processing element can be implemented in numerous ways, with software and/or hardware, to perform the various functions required. It may comprise a data processing element which can employ one or more microprocessors that may be programmed using software (e.g., microcode) to perform the required functions. It may however be implemented with or without employing a processor, and also may be implemented as a combination of dedicated hardware to perform some functions and a processor (e.g., one or more programmed microprocessors and associated circuitry) to perform other functions.

As in FIG. 1, the processing element 160 switches the two-way aperture valves selectively between the overpressure and underpressure lines 140, 150.

In all of the above examples, the duct systems can have any shape of conduits. Usually there are pipes and hoses connected to each other with splittings where necessary. Although the valves 114 are shown adjacent the openings of the respective apertures 112, in practice they are connected by pipes or hoses, so that the spatial disposition of the valves 114 need not directly mirror the array of apertures.

Examples of processing element components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media such as volatile and non-volatile computer memory such as RAM, PROM, EPROM, and EEPROM. The storage media may be encoded with one or more programs that, when executed on one or more processors and/or controllers, perform the required functions. Various storage media may be fixed within a processor or controller or may be transportable, such that the one or more programs stored thereon can be loaded into a processor or controller.

A computer program product may be provided that comprises a computer-readable data carrier having stored thereon computer program code for implementing one or more embodiments of the method. The computer program code typically is code that can be executed on the processing element 160 of the imprinting apparatus 700, and which causes the processing element 160 to control the imprinting apparatus 700 in accordance with the one or more embodiments of this method. The imprinting apparatus 700 may include the computer program product. Any suitable computer-readable data carrier may be used; non-limiting examples of such computer-readable data carriers include a CD, DVD, Flash memory, an Internet-accessible data carrier such as a solid state or magnetic disk, which disk may be located in an Internet server, and so on.

In an example, aspects of the computer program code may be derived from a design file specifying the imprinting pattern 106 of the flexible stamp 104, such as a GDSII file. In particular, such a file may be automatically evaluated to establish the feature variations in the imprinting pattern 106 and to derive the optimal imprinting process parameters such as the required rate variations in the imprinting step, imprinting direction, change in gap dimensions between imprinting and release steps, required rate variations in the release step, release direction and so on. These derived parameters may be included in the imprinting apparatus control program to be executed by the processing element 160.

Examples of a usable printing process and further details of an apparatus are disclosed in EP 3126909A.

In summary there is disclosed a method of imprinting a substrate (180), comprising affixing a flexible stamp (104) carrying an imprinting pattern (106) to a first carrier (102) comprising an array of apertures (112) which, by gas pressure, either pull the flexible stamp towards the first carrier or push it away; pushing it to a second carrier (170) carrying a substrate (180) with a resist layer (182), leaving a gap (190) for creating a controllable contact area between the flexible stamp and the substrate and space (196) between the first carrier and the flexible stamp; progressively pushing areas of the flexible stamp into the resist layer to imprint it; developing the resist layer; and progressively releasing the flexible stamp by applying suction through successive apertures whilst controlling the inward flow of gas to the space (196) through the apertures that are not yet under suction in order to maintain the space (196) there above ambient but below a predetermined maximum pressure.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An apparatus which is configured to operate an array of pneumatically operated apertures comprised in a first carrier for an imprint apparatus, wherein the first carrier is configured to hold a flexible stamp having an imprinting pattern, wherein each of the pneumatically operated apertures is operable in a first configuration and in a second configuration, wherein in the first configuration a holding pressure is provided to it for holding a part of the flexible stamp relative to the first carrier, and wherein in the second configuration a releasing pressure is provided to it for releasing the part of the flexible stamp from the first carrier, the apparatus comprising:
 a duct system for providing the releasing pressure to the plurality of pneumatically operated apertures, the duct system comprising:
  a gas entrance opening, wherein the gas entrance opening is configured to receive gas from a gas supply at a supply pressure; and
  a pressure regulator, wherein the pressure regulator is configured to regulate the releasing pressure for one or more apertures of the array of apertures connected to a section of the duct system to be between a set regulator pressure value and the supply pressure, when the gas supply is attached to the duct system, while at least temporarily allowing a gas flow from the gas supply along the section of the duct system towards the pressure regulator.

2. The apparatus of claim 1, wherein the pressure regulator comprises a backpressure regulator.

3. The apparatus of claim 1, wherein the apparatus comprises a forward pressure regulator connected to the duct system, wherein the forward pressure regulator is configured to connect to the gas supply, wherein the forward pressure regulator is configured to control the supply pressure.

4. The apparatus of claim 1, wherein the duct system comprises a plurality of openings disposed along the section of the duct system, wherein each of the openings is connected to a respective one of the plurality of apertures.

5. The apparatus of claim 1, wherein the duct system comprises one or more additional pressure regulators, and at least two ducts each connected to the gas entrance opening with one end, wherein each duct is connected to one or more of the pressure regulators, wherein each duct has a part of the section of the duct system.

6. The apparatus of claim 1, wherein the apparatus comprises:

a pressure sensor, wherein the pressure sensor is configured to sense the releasing pressure, and a pressure sensor controller, wherein the pressure sensor controller is configured to control the pressure sensor to adjust the set regulator pressure value in dependence of the sensed releasing pressure.

7. The apparatus of claim 6, further comprising a further controller, wherein the further controller is configured to supply the supply pressure of the gas supply in dependence of the sensed releasing pressure.

8. The apparatus of claim 1, further comprising:

at least one gas flow regulator connected to the duct system, wherein the at least one gas flow regulator is configured to adjust the gas flow in the duct system at a location between the gas entrance opening and one or more of the apertures of the plurality of apertures.

9. The apparatus of claim 1, wherein the duct system is a first duct system, the apparatus further comprising a second duct system for providing the holding pressure to the plurality of pneumatically operated apertures, wherein the second duct system is configured for connection to a gas removal unit for providing the holding pressure.

10. The apparatus of claim 9, further comprising a pressure switching unit connected between the second duct system and each of the plurality of pneumatically operated apertures, and connected between the first duct system and each of the plurality of pneumatically operated apertures, wherein the switching unit is configured for individually switching the plurality of pneumatically operated apertures between the holding pressure and the releasing pressure.

11. The apparatus of claim 10, wherein the switching unit comprises a plurality of valves, wherein the valves are configured for individually switching a particular one of the plurality of apertures between the first configuration and the second configuration.

12. The apparatus of claim 1, further comprising the first carrier for holding the flexible stamp having an imprinting pattern, wherein the first carrier has the array of pneumatically operated apertures, wherein each of the pneumatically operated apertures is operable in the first configuration in which the holding pressure is provided to it for holding the part of the flexible stamp relative to the first carrier, and is operable in the second configuration in which the releasing pressure is provided to it for releasing the part of the flexible stamp from the first carrier.

13. A method of operating an imprinting apparatus with a pneumatic system, wherein the imprinting apparatus comprises a first carrier having a plurality of pneumatically operated apertures, wherein the first carrier is configured to hold a flexible stamp having an imprinting pattern, and wherein the pneumatic system comprises a duct system including a gas entrance opening and a pressure regulator, the method comprising:

receiving at the gas entrance opening gas from a gas supply at a supply pressure; and controlling pressure via the duct system for each of the plurality of pneumatically operated apertures, wherein controlling the pressure for each of the plurality of pneumatically operated apertures comprises:

operating each of the pneumatically operated apertures in a first configuration, wherein in the first configuration a holding pressure is provided to it for holding a part of the flexible stamp relative to the first carrier, operating each of the pneumatically operated apertures in a second configuration, wherein in the second configuration a releasing pressure is provided to it for releasing the part of the flexible stamp from the first carrier, and a controller controlling the pressure regulator to regulate the releasing pressure for one or more apertures of the array of apertures connected to a section of the duct system to be between a set regulator pressure value and the supply pressure, when the gas supply is attached to the duct system, while at least temporarily allowing a gas flow from the gas supply along the section of the duct system towards the pressure regulator.

14. The method of claim 13, comprising an imprinting operation, wherein the imprinting operation is performed by switching at least some of the apertures from the first configuration to the second configuration, wherein the supply pressure is regulated at a value which is more than 50 mBar above a reference pressure, and the set regulator pressure value is set at a value higher than 5 mBar and lower than the regulated supply pressure.

15. The method of claim 14, wherein the apparatus comprises one or more flow regulators, and wherein the method further comprises a stamp release operation, wherein a first flow rate in the stamp release operation is controlled by the one or more flow regulators and is lower than a second flow rate as controlled by the one or more flow regulators in the imprinting operation.

16. The method of claim 13, wherein the pressure regulator comprises a backpressure regulator, and wherein controlling the pressure regulator comprises controlling the backpressure regulator to control the pressure in the duct.

17. The method of claim 13, wherein the apparatus comprises a forward pressure regulator connected to the duct system, wherein the forward pressure regulator is configured to connect to the gas supply, and wherein the method comprises controlling the forward pressure regulator to control the supply pressure.

18. The method of claim 13, wherein the apparatus comprises a pressure sensor and a pressure sensor controller, wherein the method comprises:

sensing the releasing pressure by the pressure sensor, and controlling the pressure sensor to adjust the set regulator pressure value in dependence of the sensed releasing pressure.

* * * * *